United States Patent
Inui et al.

(10) Patent No.: US 7,190,055 B2
(45) Date of Patent: Mar. 13, 2007

(54) LEAD FRAME AND SEMICONDUCTOR DEVICE

(75) Inventors: Tadahisa Inui, Osaka (JP); Motoaki Satou, Kyoto (JP); Toshiyuki Fukuda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/396,608

(22) Filed: Apr. 4, 2006

(65) Prior Publication Data

US 2006/0220190 A1 Oct. 5, 2006

(30) Foreign Application Priority Data

Apr. 4, 2005 (JP) .............................. 2005-106968
Feb. 24, 2006 (JP) .............................. 2006-047599

(51) Int. Cl.
*H01L 23/495* (2006.01)
(52) U.S. Cl. .............................. 257/669; 257/E23.037; 257/676
(58) Field of Classification Search ................ 361/723, 361/813; 438/123; 257/666, 672–676, 669, 257/723, 735, 736, 775, 776, 692–696, 726–727, 257/773
See application file for complete search history.

(56) References Cited

U.S. PATENT DOCUMENTS 6,528,868 B1 * 3/2003 Weiblen et al. ............. 257/669
7,071,523 B2 * 7/2006 Yano et al. .................. 257/433

FOREIGN PATENT DOCUMENTS

JP 3-256353 11/1991

* cited by examiner

*Primary Examiner*—B. William Baumeister
*Assistant Examiner*—Dana Farahani
(74) *Attorney, Agent, or Firm*—Steptoe & Johnson LLP

(57) ABSTRACT

A lead frame is provided. Although there is a die pad (2) located to deviate from a main plane center line of a resin molding area (10), a die pad connecting portion (6) is located to deviate from the main plane center line of the resin molding area in a direction opposite to the deviation direction of the deviated die pad (2), so that it is possible to reduce a Z-directional vertical variation of the die pad in processes. Accordingly, it is possible to prevent resin molding defects such as package bending, voids, failure of resin filling, wire disconnection, exposure of semiconductor chips, and exposure of die pads.

9 Claims, 7 Drawing Sheets

Z-DIRECTIONAL VARIATION OF DIE PAD: (A-B)

LEAD FRAME AND SEMICONDUCTOR DEVICE

BACKGROUND OF THE INVENTION

1. Field of the Invention

The present invention relates to a lead frame for a multi-chip package (hereinafter, referred to as an MCP) in which two semiconductor chips with semiconductor integrated circuits including semiconductor devices are mounted in parallel in a single package, and to a semiconductor device using the lead frame.

2. Description of the Related Art

As semiconductor integrated circuits with high performance have been integrated with a high density, an MCP capable of mounting a plurality of semiconductor chips has been substituted for a package capable of mounting a single semiconductor chip. The MCP can implement high-density mounting and combine performances of semiconductor chips in different types of diffusion processes, so that the MCP has advantages of development period shortening and low production cost.

Now, a conventional lead frame will be described with reference to FIGS. 8 and 9.

FIG. 8 is a plan view showing a conventional lead frame. FIGS. 9A and 9B are cross sectional views showing the conventional lead frame. In FIGS. 9A and 9B, the cross sections of the semiconductor device using the lead frame of FIG. 8 are taken along line A–B in order to represent vertical variations of die pads thereof.

In the figures, reference numerals Za and Zb denote vertical variations of a die pad 2 in a Z-direction, that is, a direction perpendicular to a mounting plane thereof.

In the figures, reference numerals Za' and Zb' denote vertical variations of the die pad 2 in the Z-direction caused from counteraction thereof.

As shown in FIG. 8, the conventional lead frame includes die pads 1 and 2 which have different sizes and are mounted thereon with two semiconductor chips, a frame 3 surrounding the die pads 1 and 2 on four sides in a quadrilateral shape, suspension leads 4a, 4b, 5a, and 5b respectively extending from four inner corners of the frame 3 and supporting the die pads, a die pad connecting portion 6 connecting the die pads, a plurality of inner leads 7 arranged radially to surround the die pads, a plurality of outer leads 8 connected to the plurality of inner leads 7 and having distal end portions thereof connected to the inner side of the frame 3, and a tie bar 9 connecting the outer leads in an arrangement of a series of strips and surrounding quadrilaterally, within the frame 3, the die pads 1 and 2, the die pad connecting portion 6, and the inner leads 7, wherein at least one die pad and the die pad connecting portion are located to deviate from the center line L0 of the main plane of a resin molding area 10.

The die pad is located to deviate from the main plane center line L0 of the resin molding area 10 in order to secure a region where a plurality of bond pads formed on semiconductor chips and the inner leads are connected by means of metal wires and to reduce the lengths of the wires as much as possible.

However, in a lead frame for an MCP such as a conventional quad flat package (hereinafter, referred to as a QFP), the suspension leads are different from each other in shape and length, so that it is difficult to support the die pads in a balanced manner. In addition, although the die pad deviating from the main plane center line of the resin molding area is located to be aligned with the main plane center line of the die pad connecting portion, it is difficult to support the die pads in a balanced manner.

As shown in FIGS. 9A and 9B, in an unbalanced arrangement of die pads such as that of the conventional lead frame for QFP-MCP, supporting forces exerted on the die pads are caused to unbalance, and Z-directional vertical variations Za and Zb (and counteraction variations Za' and Zb') increase in assembling processes.

Due to the Z-directional vertical variation accumulated in the previous processes, there arises such a problem that resin molding defects occur in the molding process, the defects including package bending, voids, failure of resin filling, wire disconnection, exposure of semiconductor chips, and exposure of die pads.

In addition, in the trend of semiconductor devices, before and until the first half of 1990, thin small-sized products were developed by using a QFP resin thickness in a range of from 2.0 mm to 3.0 mm as a main stream of semiconductor devices. Since the second half of 1990, commercially provided products have had a resin thickness in a range of from 1.0 mm (in TQFP, an attached height is 1.2 mm or less) to 1.4 mm (in LQFP; an attached height is 1.7 mm or less). Such products have become the mainstream in the recent trend. In addition, from the beginning of 2000, products having a resin thickness in a range of from 0.7 mm to 0.8 mm (in WQFP; an attached height is 1.0 mm or less) have been developed and commercially provided. As the QFP resin thickness becomes smaller and smaller, there arises a dominant problem that the resin molding defects are caused by the Z-directional vertical variations of die pads.

SUMMARY OF THE INVENTION

The present invention provides a lead frame having an excellent assembling performance for preventing resin molding defects in order to solve the problems of the QFP-MCP caused by unbalanced arrangement of die pads.

According to an aspect of the present invention, there is provided a lead frame for a multi-chip package mounted with two semiconductor chips, the lead frame comprising: a frame; two die pads differing in size and mounting thereon the semiconductor chips respectively; suspension leads supporting the die pads to the frame; a die pad connecting portion connecting the die pads; and leads supported to the frame and connected to terminals formed on the semiconductor chips by means of metal wires, wherein, one of the two die pads and the die pad connecting portion are arranged to satisfy a positional relationship that a main plane center line of the one die pad deviates by a given distance from a main plane center line of a resin molding area, the main plane center line of the resin molding area passing the two die pads, and that a main plane center line of the die pad connecting portion is aligned with the main plane center line of the resin molding area or located on an opposite side to the main plane center line of the one die pad with respect to the main plane center line of the resin molding area.

In the above aspect of the present invention, a main plane center line of the other die pad of the die pads may be aligned with the main plane center line of the resin molding area, and an area of the other die pad may be larger than an area of the one die pad.

In addition, the die pad connecting portion has a width and a length that are smaller than widths and lengths of the respective two die pads, and is shaped as a narrow portion recessed on both sides thereof, and the main plane center lines of the resin molding area, the other die pad, and the die pad connecting portion are aligned with each other.

In addition, the suspension leads supporting the die pad located to deviate from the main plane center line of the resin molding area has a bent portion in the vicinity of the die pad, and the suspension lead supporting the die pad having a main plane center line aligned with the main plane center line of the resin molding area has a shape of a straight line.

In addition, the suspension lead supporting the die pad located to deviate from the main plane center line of the resin molding area has a bent portion in the vicinity of the die pad, a width-enlarged portion is provided between the bent portion and a die pad supporting portion in the vicinity of the die pads, the width-enlarged portion having a width larger than that of the suspension lead, and the width-enlarged portion of the suspension lead in a direction opposite to the deviation of the die pad has a larger length than the width-enlarged portion of the die pad.

According to another aspect of the present invention, there is provided a semiconductor device including the lead frame according to the above aspect, wherein one of the two die pads located within the lead frame and differing in size deviates toward a resin injection hole with respect to the main plane center line of the resin molding area, the one die pad being on a side close to the resin injection hole.

In the above aspect of the present invention, a longest metal wire is located in a downstream region of a molding resin flow than the die pad located to deviate from the main plane center line of the resin molding area.

In addition, the semiconductor device has a resin thickness in a range of from 1.4 mm to 0.7 mm.

In addition, one of the two die pads differing in size and located close to the resin injection hole has a Z-directional vertical variation having an inclination slanting from a position close to the resin injection hole to a position apart from the resin injection hole, and an amount of the variation is not more than 0.10 mm.

DESCRIPTION OF THE PREFERRED EMBODIMENTS

A semiconductor circuit device according to embodiments of the present invention will be described in detail with reference to the accompanying drawings.

Now, lead frames and semiconductor devices using the lead frames according to embodiments will be described with reference to the drawings.

[Lead Frame]

Figure 1:
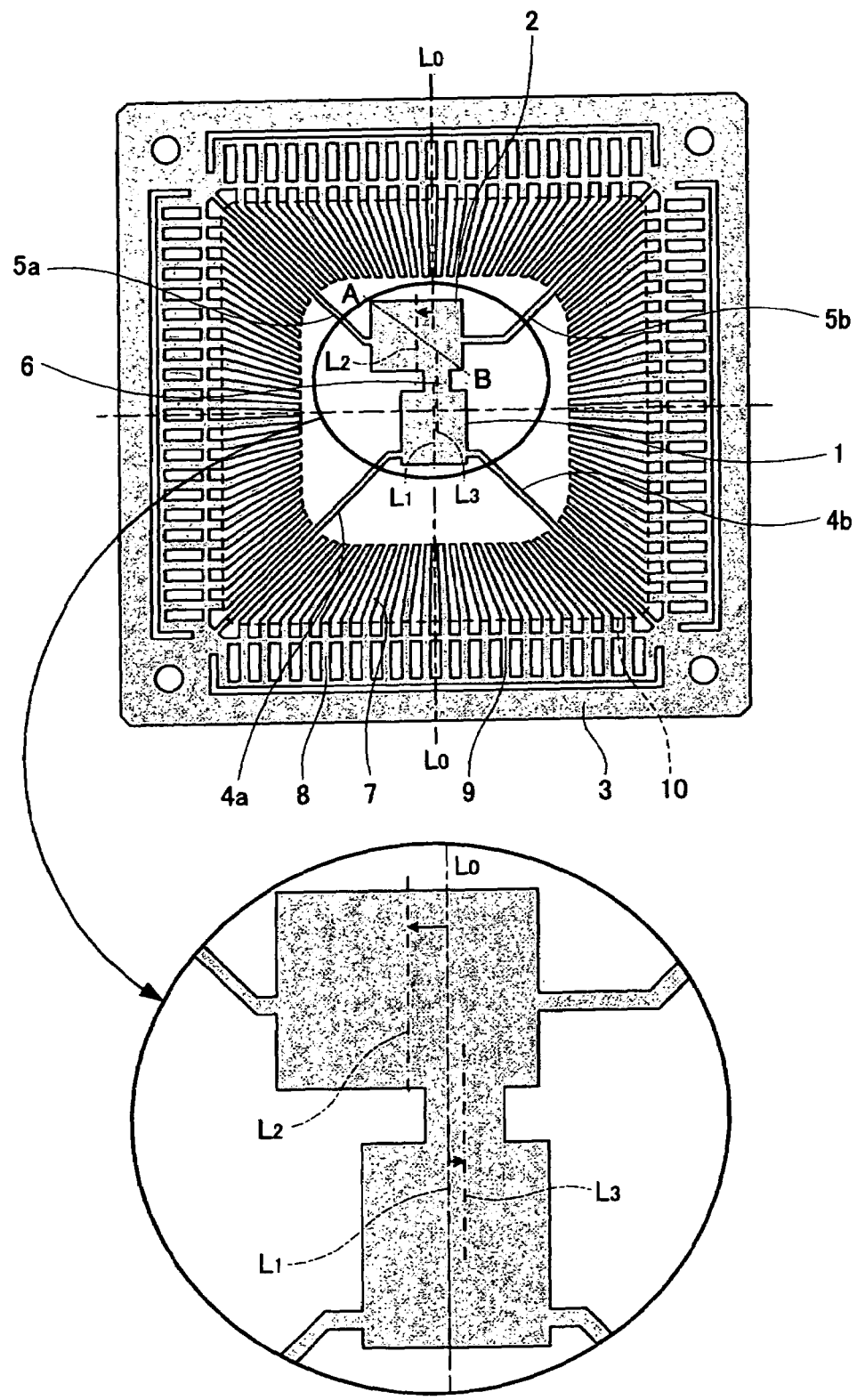
FIG. 1 is a plan view of a lead frame according to a first embodiment of the present invention.

FIG. 1 is a plan view showing a lead frame according to the first embodiment of the present invention.

Figure 2:
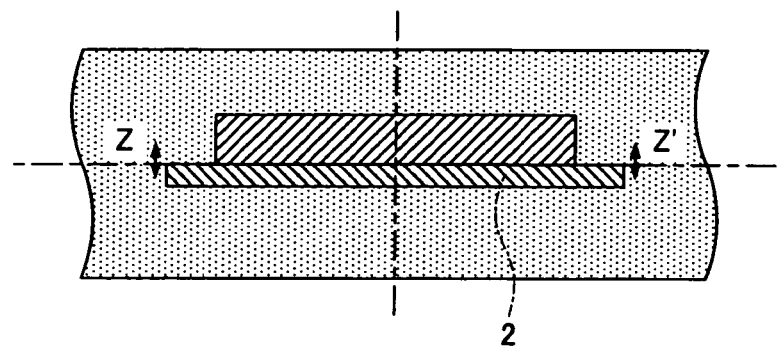
FIG. 2 is a cross sectional view of a semiconductor device including the lead frame according to the first embodiment.

In FIG. 1, reference numeral L0 denotes a main plane center line of a resin molding area, reference numeral L1 denotes a width-directional center line of a die pad 1, and reference numeral L2 denotes a width-directional center line of a die pad 2. The center lines L1 and L2 are aligned with each other. FIG. 2 is a cross sectional view showing a semiconductor device employing the lead frame according to the first embodiment. In FIG. 2, the cross section of the semiconductor device using the lead frame of FIG. 1 is taken along line A–B of FIG. 1.

In the figure, reference numeral Z denotes a Z-directional vertical variation of the die pad 2.

As shown in FIG. 1, the lead frame includes die pads 1 and 2 which differ in size from each other and have semiconductor chips mounted thereon, a frame 3 surrounding the die pads 1 and 2 in a quadrilateral shape, suspension leads 4a and 4b supporting the die pad 1 and suspension leads 5a and 5b supporting the die pad 2, respectively extending from the four inner corners of the frame 3, a die pad connecting portion 6 connecting the die pads 1 and 2, a plurality of inner leads 7 arranged in a radial shape and surrounding the die pads 1 and 2, a plurality of outer leads 8 connected to a plurality of the inner leads 7 and having distal end portions connected to an inner side of the frame 3, and a tie bar 9 connecting the outer leads 8 in a shape of a series of strips and surrounding the die pads 1 and 2, the die pad connecting portion 6, and the inner leads 7 within the frame 3. In addition, the die pad 2 is located to deviate from the main plane center line L0 of the resin molding area 10, and the die pad connecting portion 6 is located to deviate from the main plane center line L2 of the die pad 2 in a direction opposite to the deviation direction of the die pad 2. Namely, the main plane center line L2 of the die pad 2 deviates from the main plane center line L0 of the resin molding area 10 in a direction indicated with an arrow, and the main plane center line L3 of the die pad connecting portion 6 deviates from the main plane center line L2 of the die pad 2 in the opposite direction.

Figure 9A:
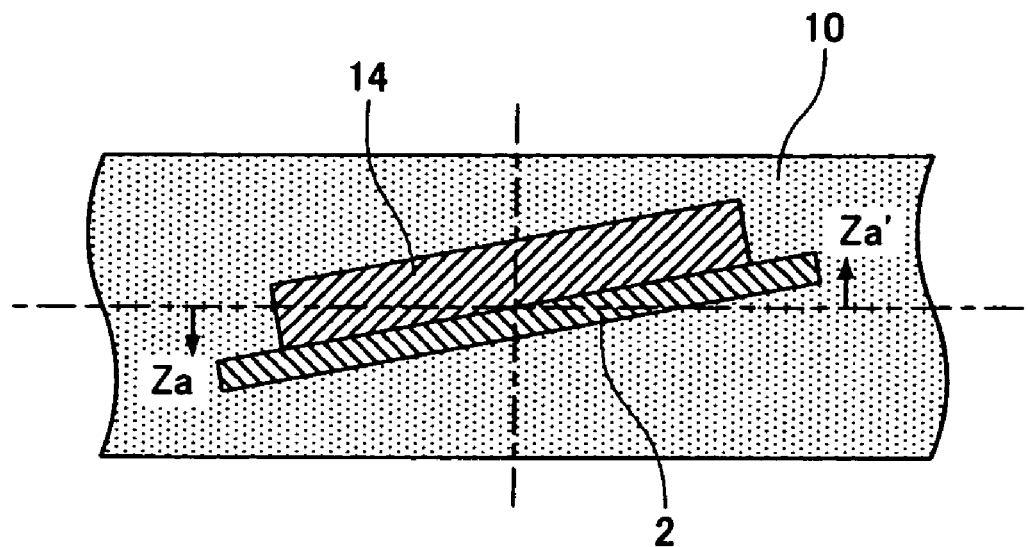
FIG. 9A is a cross sectional view of the conventional lead frame.
Figure 9B:
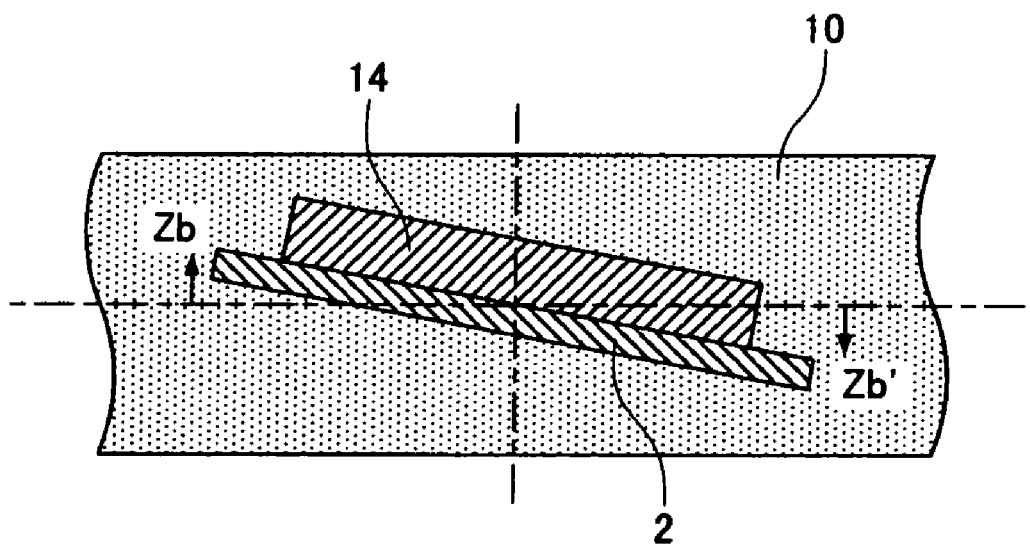
FIG. 9B is a cross sectional view of the conventional lead frame.

As shown in FIG. 2, in a die bonding process, a wire bonding process, or a molding process, mechanical impacts, vibration, pressure, weight, and the like cause the Z-directional vertical variation of the die pad 2. Among them, influence of resin injection in the molding process is greatly dominated, and due to unbalance of the die pads and the vertical resin flow of the semiconductor chip, a portion A of the die pad 2 shown in the A–B cross sectional view separated from a supporting position is directly affected by the stresses of the vertical variations Z and Z' of die pad. However, since the die pad connecting portion 6 is located to deviate in the direction opposite to the deviation direction of the die pad 2, the stresses are balanced, and a portion B of the die pad 2 is securely fixed to the die pad connecting portion 6. Therefore, variations Za' and Zb' (see FIGS. 9A and 9B) caused from counteraction of the die pad 2 and the semiconductor chip can be effectively suppressed (Z'<Za' and Z<Zb'), so that the vertical variation Z of die pad at the portion A thereof can also be suppressed.

Accordingly, even in a case where a die pad is located to deviate from the main plane center line of the resin molding area, since the die pad connecting portion is located to deviate in the direction opposite to the deviation direction of the deviated die pad, the deviated die pad can be securely fixed to the die pad connecting portion. As a result, in the processes, it is possible to reduce the Z-directional vertical variation of die pad and prevent resin molding defects such as package bending, voids, failure of resin filling, wire disconnection, exposure of semiconductor chips, and exposure of die pads.

Figure 3:
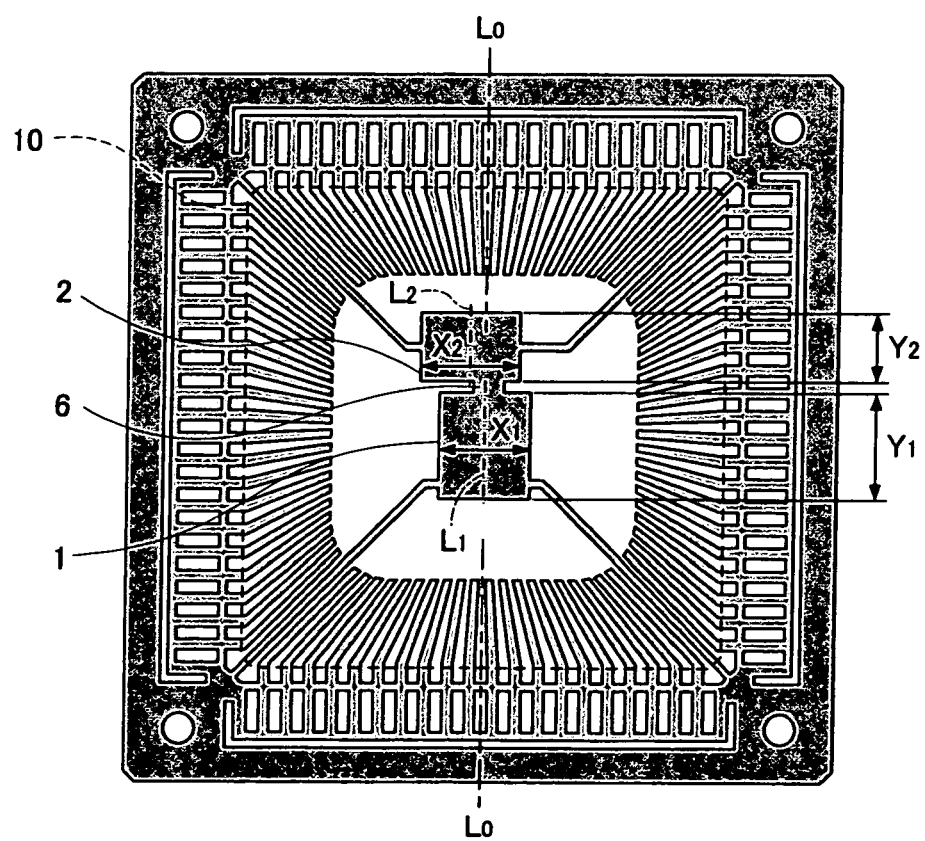
FIG. 3 is a plan view of a lead frame according to a second embodiment of the present invention.

FIG. 3 is a plan view showing a lead frame according to a second embodiment of the present invention.

In FIG. 3, reference numeral X1 denotes a width (a horizontal length in the figure) of a die pad 1, and reference numeral Y1 denotes a length (a vertical length in the figure) of the die pad 1. Reference numeral X2 denotes a width (a horizontal length in the figure) of a die pad 2, and reference numeral Y2 denotes a length (a vertical length in the figure) of the die pad 2. Reference numeral L0 denotes a main plane center line of a resin molding area, reference numeral L1 denotes a main plane center line of the die pad 1, and reference numeral L2 denotes a main plane center line of a die pad 2. The main plane center line L1 and L2 are aligned with each other.

As shown in FIG. 3, the die pad 2 is located to deviate from the main plane center line L0 of the resin molding area 10, and the die pad connecting portion 6 is located to deviate from the main plane center line L2 of the die pad 2 in a direction opposite to the deviation direction of the die pad 2. In addition, an area (a product of X1 and Y1) of the die pad 1 is designed to be larger than an area (a product of X2 and Y2) of the die pad 2. In general, in the processes, a Z-directional vertical variation of die pad is dominated by a large-area die pad. Since the area of the die pad 1 is formed to be larger than the area of the die pad 2, the Z-directional vertical variation of die pad in the processes is dominated by the die pad 1 which does not deviate from the main plane center line of the die pad connecting portion, so that the Z-directional vertical variation of die pad in the assembly processes can be stably reduced.

Accordingly, even in a case where a die pad is located to deviate from the main plane center line of the resin molding area, since the area of the non-deviated die pad is formed to be larger than the area of the deviated die pad, so that, in the processes, it is possible to reduce the Z-directional vertical variation of die pad and prevent resin molding defects such as package bending, voids, failure of resin filling, wire disconnection, exposure of semiconductor chips, and exposure of die pads.

Figure 4:
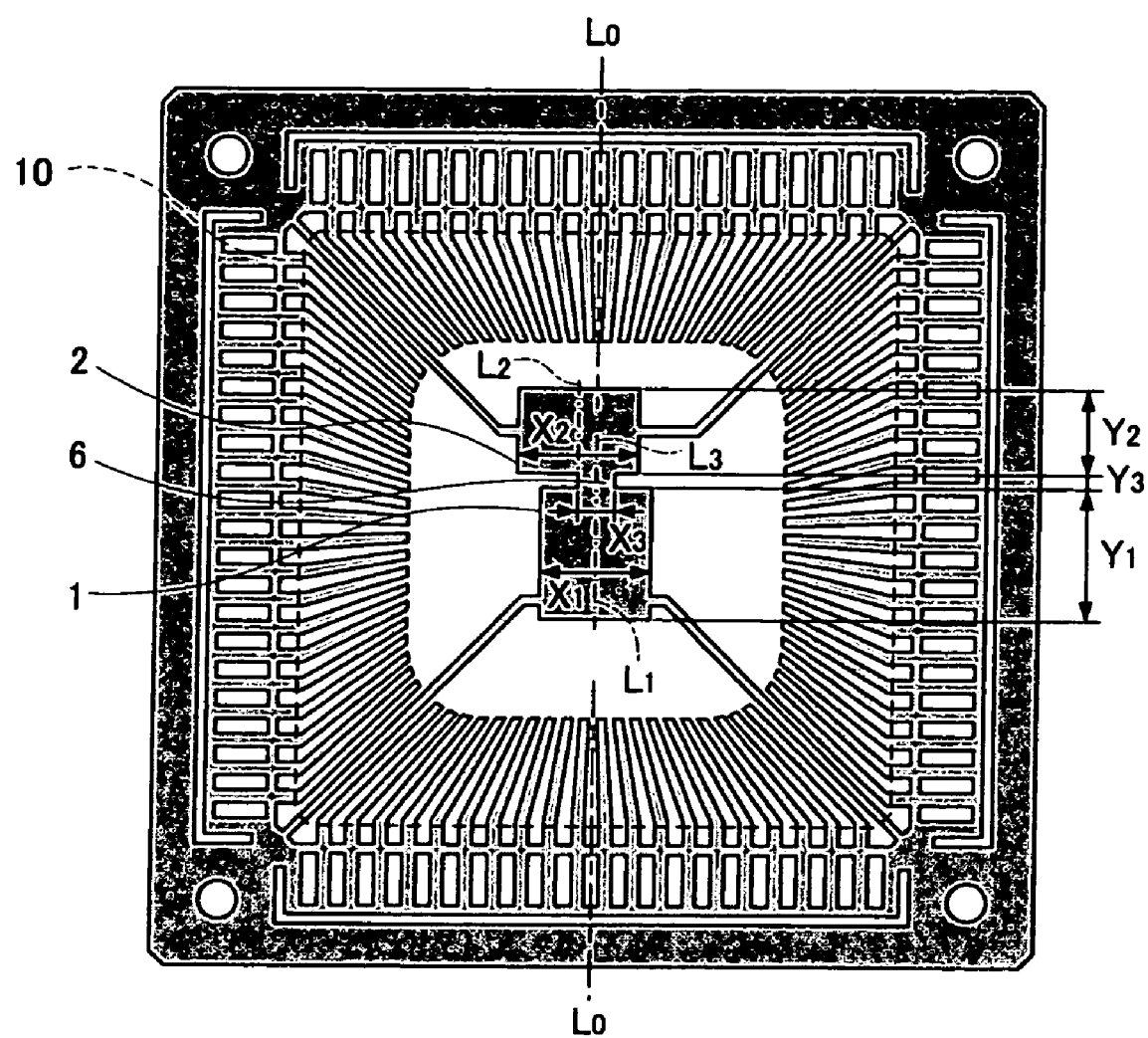
FIG. 4 is a plan view of a lead frame according to a third embodiment of the present invention.

FIG. 4 is a plan view showing a lead frame according to a third embodiment of the present invention.

In FIG. 4, reference numeral X1 denotes a width (a horizontal length in the figure) of a die pad 1, and reference numeral Y1 denotes a length (a vertical length in the figure) of the die pad 1. Reference numeral X2 denotes a width (a horizontal length in the figure) of a die pad 2, and reference numeral Y2 denotes a length (a vertical length in the figure) of the die pad 2. Reference numeral X3 denotes a width (a horizontal length in the figure) of a die pad connecting portion 6, and reference numeral Y3 denotes a length (a vertical length in the figure) of the die pad connecting portion 6. Reference numeral L0 denotes a main plane center line of a resin molding area, reference numeral L1 denotes a main plane center line of the die pad 1, reference numeral L2 denotes a main plane center line of a die pad 2, and reference numeral L3 denotes a main plane center line of the die pad connecting portion 6. The main plane center line L1, L2, and L3 are aligned with each other.

As shown in FIG. 4, the die pad 2 is located to deviate from the main plane center line L0 of the resin molding area 10, and the die pad connecting portion 6 is located to deviate from the main plane center line L2 of the die pad 2 in a direction opposite to the deviation direction of the die pad 2. In addition, the width X3 of the die pad connecting portion 6 is formed to be smaller than the widths X1 and X2 of the die pads 1 and 2, and the die pad connecting portion 6 is formed to be a narrow portion recessed on both sides thereof. In addition, the main plane center lines L1 and L3 of the die pad 1 and the die pad connecting portion 6 are aligned to each other.

Since the die pad connecting portion 6 is formed to be a narrow portion recessed on both-sides thereof, position alignment of the semiconductor chips which are mounted on the die pads 1 and 2 in the die boding process can be easily performed, and the positional errors in the X and Y directions can be reduced. In addition, portions affected by the vertical resin flow can be reduced in the molding process, so that it is possible to prevent insufficient resin filling. In addition, in a process of mounting the semiconductor on a substrate, an inner stress caused from reflow heat can be distributed, so that it is possible to prevent surface peeling. In addition, since the main plane center lines L1 and L3 of the die pad 1 and the die pad connecting portion 6 are aligned to each other, the die pad connecting portion 6 can be stably and supported by the die pad 1 with balance, so that it is possible to stably reduce the Z-directional vertical variation of die pad in the assembly process.

Therefore, by making the width of the die pad connecting portion to be smaller than the widths of the die pads and by aligning the main plane center line of the die pad connecting portion with the main plane center line of the resin molding area, the die pad connecting portion can be stably supported by the non-deviated die pad. As a result, in the processes, it is possible to reduce the Z-directional vertical variation of die pad and prevent resin molding defects such as package bending, voids, failure of resin filling, wire disconnection, exposure of semiconductor chips, and exposure of die pads. In addition, it is possible to improve a mounting capability of the substrate.

Figure 5:
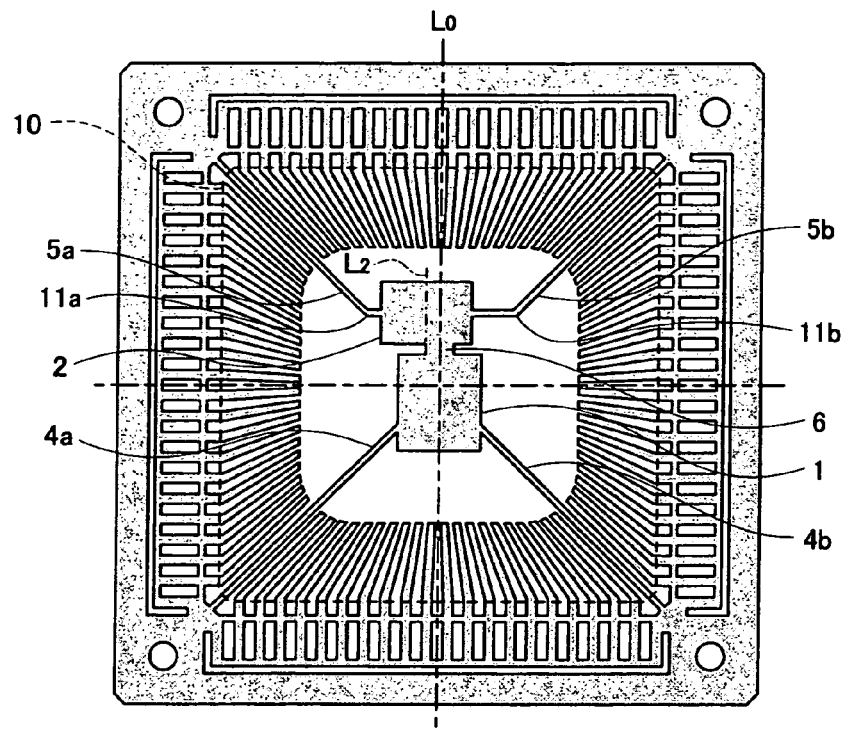
FIG. 5 is a plan view showing a lead frame according to a fourth embodiment of the present invention.

FIG. 5 is a plan view showing a lead frame according to a fourth embodiment of the present invention.

As shown in FIG. 5, the die pad 2 is located to deviate from the main plane center line L0 of the resin molding area 10, and the die pad connecting portion 6 is located to deviate from the main plane center line L2 of the die pad 2 in a direction opposite to the deviation direction of the die pad 2. In addition, suspension leads 5a and 5b supporting the die pad 1 are formed to have bent portions 11a and 11b in the vicinity of the die pad 2. In addition, the suspension leads 4a and 4b are formed to have a shape of a straight line.

Since the suspension leads 5a and 5b supporting the die pad 1 have the bent portions 11a and 11b in the vicinity of the die pad 2, the suspension leads 5a and 5b are allowed to be close to each other by the associated length, and the center of gravity of the die pad 2 including the suspension leads 4a and 4b is allowed to be close to the main plane center line of the resin molding area. As a result, the die pad 2 can be stably supported with balance with respect to the center of the main plane of the resin molding area, so that the supporting force can be stabilized.

Accordingly, in the molding resin injection process, the stresses caused by the unbalance of the die pad 2 and the semiconductor chip due to the vertical resin flow can be stably suppressed with balance. In addition, since the suspension leads 4a and 4b are formed to have a shape of a straight line, the strength of the suspension lead can increase, so that the Z-directional position of the die pad 1 can be stably maintained. In addition, since the die pad 1 is stably supported, the die pad 2 can also be stably maintained.

Accordingly, since the suspension leads of the non-deviated die pad are formed to have a shape of a straight line without a bent portion, the Z-directional vertical variation of die pad can be reduced in the processes, so that it is possible to prevent resin molding defects such as package bending, voids, failure of resin filling, wire disconnection, exposure of semiconductor chips, and exposure of die pads.

Figure 6:
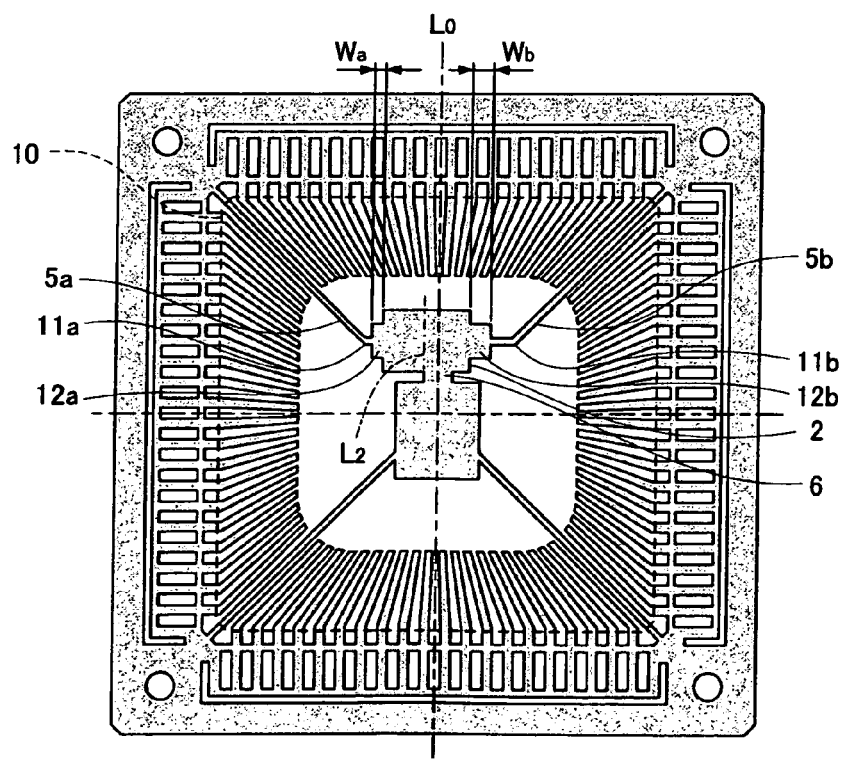
FIG. 6 is a plan view of a lead frame according to a fifth embodiment of the present invention.

FIG. 6 is a plan view showing a lead frame according to a fifth embodiment of the present invention.

In FIG. 6, reference numeral Wa denotes a length (a horizontal length in the figure) of a suspend-lead width enlarged portion 12a, and reference numeral Wb denotes a length (a horizontal length in the figure) of a suspend-lead width enlarged portion 12b.

As shown in FIG. 6, the die pad 2 is located to deviate from the main plane center line L0 of the resin molding area 10, and the die pad connecting portion 6 is located to deviate from the main plane center line L2 of the die pad 2 in a direction opposite to the deviation direction of the die pad 2. In addition, suspension leads 5a and 5b supporting the die pad 1 are formed to have bent portions 11a and 11b in the vicinity of the die pad 2. In addition, the suspend-lead width enlarged portions 12a and 12b are provided between the bent portions and the die pad supporting portions and have a width larger than the widths of the suspension leads 5a and 5b in the vicinity of the die pad. The length Wb of the suspend-lead width enlarged portion 12b in the direction opposite to the deviation direction of the die pad 2 is formed to be larger than the length Wa of the suspend-lead width enlarged portion 12a of the opposite side thereof.

Therefore, by making the width of the die pad connecting portion to be smaller than the widths of the die pads and by aligning the main plane center line of the die pad connecting portion with the main plane center line of the resin molding area, the die pad connecting portion can be stably supported by the non-deviated die pad. As a result, in the processes, it is possible to reduce the Z-directional vertical variation of die pad and prevent resin molding defects such as package bending, voids, failure of resin filling, wire disconnection, exposure of semiconductor chips, and exposure of die pads. In addition, it is possible to improve a mounting capability of the substrate.

[Semiconductor Device]

Figure 7A:
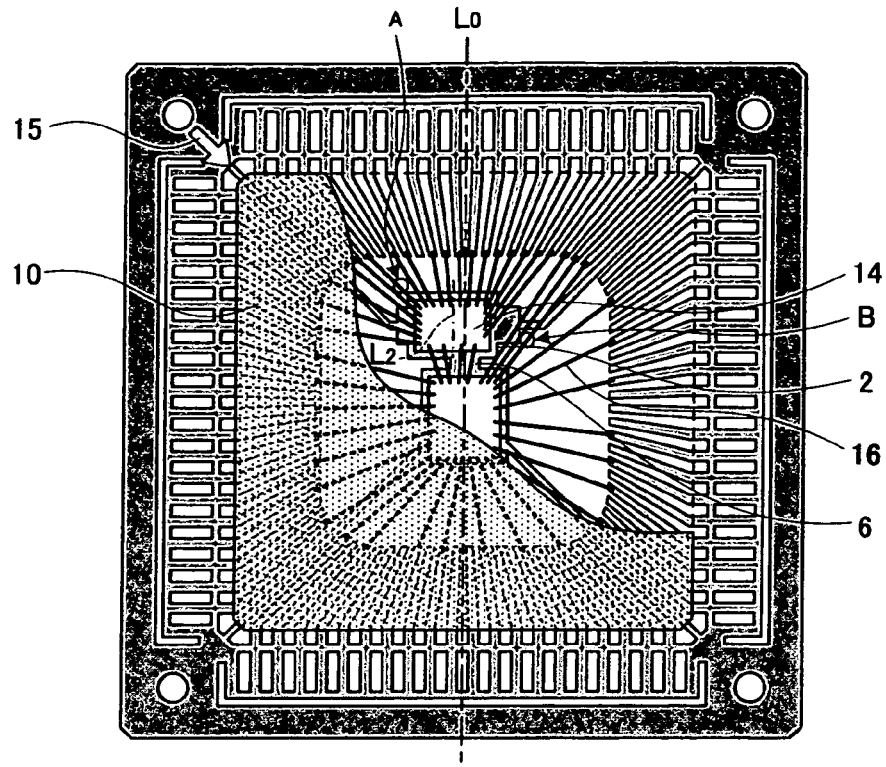
FIG. 7A is a view of an internal structure of a main plane of a semiconductor device including a lead frame according to a sixth embodiment of the present invention.

FIG. 7A is a view showing an internal structure of a main plane of a semiconductor device using a lead frame according to a sixth embodiment of the present invention.

Figure 7B:
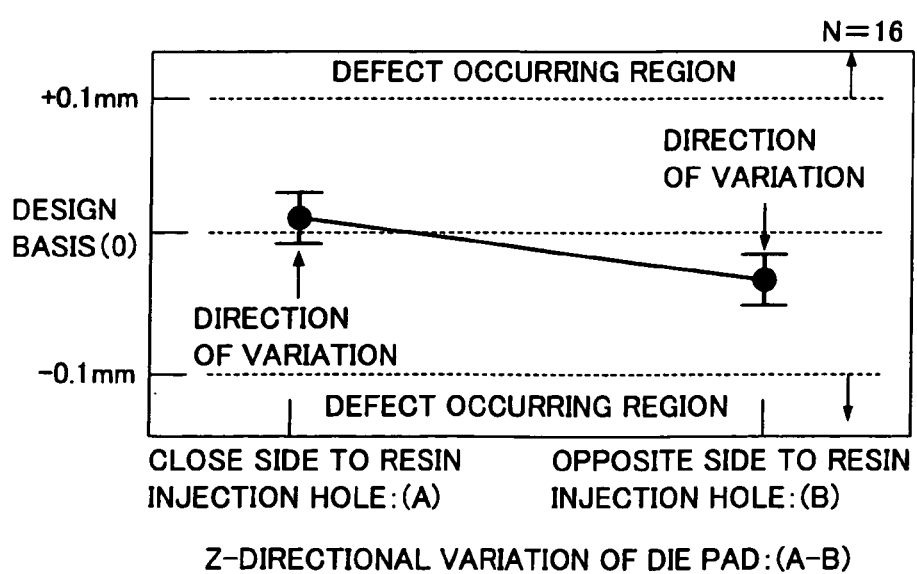
FIG. 7B is a view for explaining a Z-directional vertical variation of a die pad located close to a resin injection hole.
Figure 8:
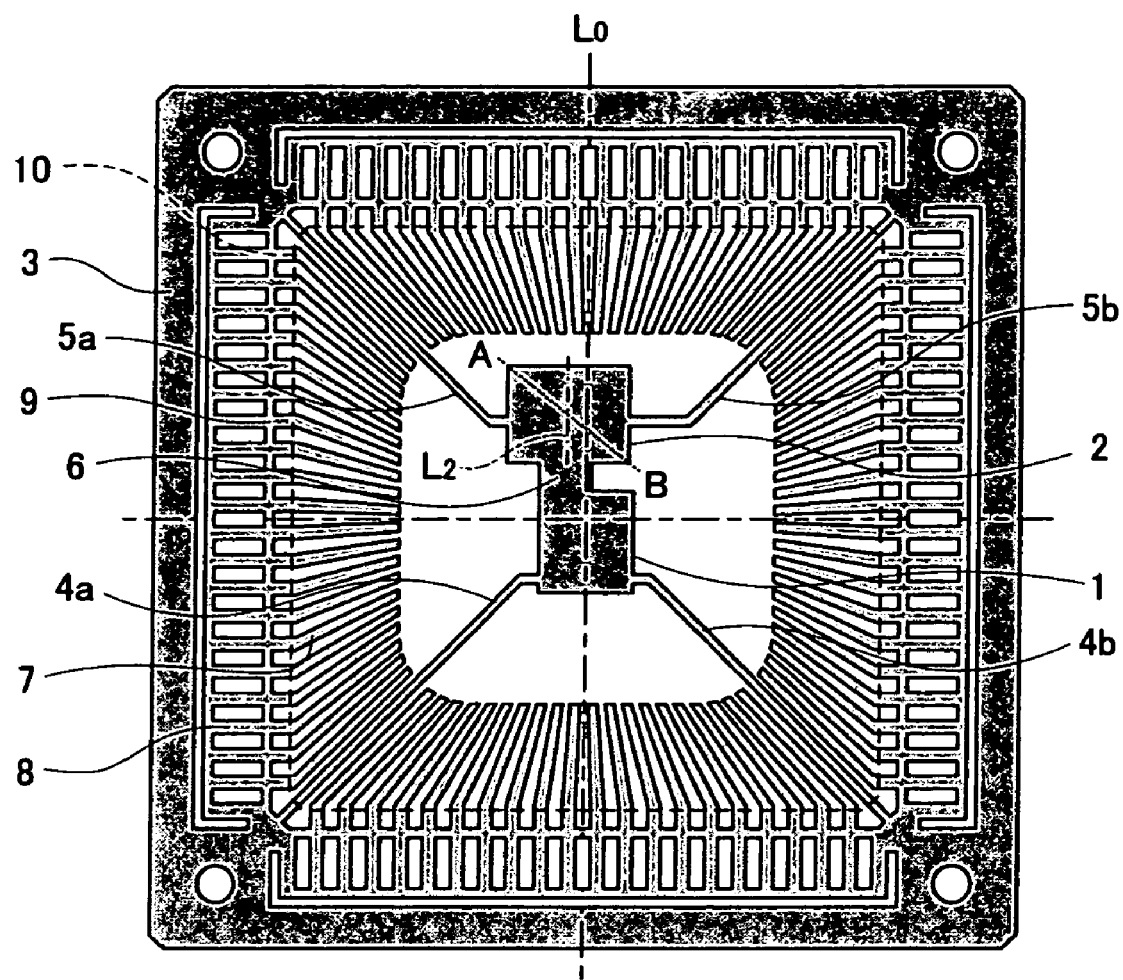
FIG. 8 is a plan view of a conventional lead frame.

FIG. 7B is a view for explaining a Z-directional vertical variation of a die pad located to be close to a resin injection hole.

As shown in FIG. 7A, the die pad 2 is located to deviate from the main plane center line L0 of the resin molding area 10, and the die pad connecting portion 6 is located to deviate from the main plane center line L2 of the die pad 2 in a direction opposite to the deviation direction of the die pad 2. In addition, the die pad 1 is located to be close to the resin injection hole 15, and the longest metal wire 16 is located at a lower position in a downstream region of the molding resin flow than the die pad 2.

In general, an amount of the wire flow depends on the wire length and an arrangement of the resin molding area due to a resin flowing property. Since the longest metal wire 16 is located at a lower downstream region of the molding resin flow than the die pad 2, the die pad 2 located at a upstream and a semiconductor chip 14 mounted on the die pad 2 serve as barriers, so that the stresses exerted to the longest metal wire 16 due to the resin flow can be reduced. In addition, with respect to the longest metal wire 16, an amount of the wire flow generated from the influence of the resin flow in the molding process can be reduced.

In the wire bonding process of the semiconductor device, electrode pads (not shown) of the semiconductor chip 14 and the distal end portions of the inner leads 7 of the lead frame are electrically connected (wire-bonded). Here, the metal wire 16 is mainly made of gold (Au) having a purity of 99.99% or more and has a diameter of from 15 μm to 30 μm. The metal wire 16 is connected with a wire bonder by using a ultrasonic thermal pressing method. A variety of lengths of wire may be used. In general, a wire having a length exceeding a length of from 4 mm to 5 mm is defined as a long wire. If a diameter of the metal wire 16 is reduced, a production cost can be reduced, but there are disadvantages in terms of a wire flow.

Therefore, by disposing the die pad to be close to the resin injection hole and disposing the longest metal wire at the lower position in the downstream of the molding resin flow than the deviated die pad, the stress exerted on the longest metal wire due to the resin flow can be reduced. Accordingly, it is possible to prevent resin molding defects such as wire pealing, wire short-circuit, and wire disconnection.

As described in the related art, as the resin thickness of QFP is reduced, the resin molding defects caused from the Z-directional vertical variation becomes dominated. For example, in case of LQFP, a resin thickness is designed to be 1.4 mm. In this case, a thickness of the semiconductor chip 14 is designed to be in a range of from 0.1 mm to 0.2 mm, and a thickness of the die pads 1 and 2 is designed to be 0.15 mm. In addition, a height (loop height) of the metal wire 16 from the semiconductor chip is designed to be in a range of from 0.05 mm to 0.2 mm. A step difference (hereinafter, referred to as a depress) is provided to the suspension leads so as to accommodate a total height of 0.55 mm (0.2 mm (height of semiconductor chip)+0.15 mm (thickness of die pads)+0.2 mm (loop height)). In general, the depress value is designed based on the sizes of the die pads or the semiconductor chip 14. In this case, the depress value is designed so that the semiconductor chip is substantially located at a center in the thickness direction. In a case where a resin thickness of 1.4 mm in LQFP can accommodate the total height of 0.55 mm (0.2 mm (height of semiconductor chip)+0.15 mm (thickness of die pads)+0.2 mm (loop height)), the Z-directional vertical variation of die pad having a value of a half of 0.85 mm, that is, a value of 0.425 mm or more is considered to be completely defective. Practically, when the resin molding is performed at a variation of 25%, that is, 0.1 mm or more, the resin flow changes, and the wire flow of the metal wire 16 is locally deformed from the resin flow. In addition, the adjacent metal wires 16 are touched to each other, so that the wire short-circuit may occur. In addition, the resin flow under the die pads 1 and 2 are locally unavailable, so that voids (cavities formed in a resin) or outer appearance defects may occur.

Here, in a resin molding method for a semiconductor device, the semiconductor chip 4 is mounted on the die pad 2, and the semiconductor chip 14 and the distal end portions of the inner leads 7 are electrically connected to each other with the metal wires 16. In this state, the lead frame is placed on a mold for resin molding (not shown). A thermoset molding resin (for example, an epoxy resin) is heated in a temperature range from 150° C. to 200° C. by using the heat of the mold so as to be fused into a liquid state. The liquid-state resin is injected through the resin injection hole 15 into the resin molding area 10 of the semiconductor device.

FIG. 7B shows a result of measuring the Z-directional vertical variation of the die pad located to be close to the resin injection hole.

As measurement sites, a site A of the die pad 2 located to be close to the resin injection hole 15 and a site B of the die pad 2 apart from the resin injection hole 15 are selected in FIG. 7A, and the Z-directional vertical variation of the die pad 2 is measured along the cross section A–B. In the measurement, the resin thickness of the semiconductor device is 1.4 mm (in LQFP), and the outer dimension of the resin mold of the semiconductor device is 14 mm×14 mm, where the number of measurement is n=16. In the embodiment, the die pad 2 located at the site A close to the resin injection hole 15 varies in a range of +0.01 mm to 0.03 mm in comparison to a designed value. In addition, the die pad 2 at the site B apart from the resin injection hole 15 varies in a range of −0.02 mm to 0.04 mm in comparison to a designed value. However, the measured values are in a range of ±0.1 mm, where the resin molding defects are remarkable which are caused by the vertical variation of the die pad.

In the embodiments, the resin thickness of the semiconductor device is formed to be 1.4 mm (in LQFP), and the outer dimension of the resin mold of the semiconductor device is formed to be 14 mm×14 mm. However, a QFP resin thickness in a range from 1.0 mm (in TQFP; an attached height is 1.2 mm or less) to 1.4 mm (in LQFP; an attached height is 1.7 mm or less) or in a range from 0.7 mm to 0.8 mm (in WQFP; an attached height is 1.0 mm or less) may be used.

Although the semiconductor devices described in the above embodiments use the lead frame described in the first embodiment, any one of the lead frames described in the second to fifth embodiments may be used for the semiconductor devices.

What is claimed is:

1. A lead frame for a multi-chip package mounted with two semiconductor chips, the lead frame comprising:
   a frame;
   two die pads differing in size and mounting thereon the semiconductor chips respectively;
   suspension leads supporting the die pads to the frame;
   a die pad connecting portion connecting the die pads; and
   leads supported to the frame and connected to terminals formed on the semiconductor chips by means of metal wires, wherein
   one of the two die pads and the die pad connecting portion are arranged to satisfy a positional relationship that a main plane center line of the one die pad deviates by a given distance from a main plane center line of a resin molding area, the main plane center line of the resin molding area passing the two die pads, and that a main plane center line of the die pad connecting portion is aligned with the main plane center line of the resin molding area or located on an opposite side to the main plane center line of the one die pad with respect to the main plane center line of the resin molding area.

2. The lead frame according to claim 1, wherein a main plane center line of the other of the die pads is aligned with the main plane center line of the resin molding area, and an area of the other die pad is larger than an area of the one die pad.

3. The lead frame according to claim 1, wherein
   the die pad connecting portion has a width and a length that are smaller than widths and lengths of the respective two die pads, and is shaped as a narrow portion being recessed on both sides thereof, and
   the main plane center lines of the resin molding area, the other of the two die pads, and the die pad connecting portion are aligned to coincide with each other.

4. The lead frame according to claim 1, wherein the suspension lead supporting the die pad located to deviate from the main plane center line of the resin molding area has a bent portion in a vicinity of the die pad, and the suspension lead for supporting the die pad having a main plane center line aligned with the main plane center line of the resin molding area has a shape of a straight line.

5. The lead frame according to claim 4, wherein
   the suspension lead supporting the die pad located to deviate from the main plane center line of the resin molding area has a bent portion in a vicinity of the die pad,
   a width-enlarged portion is provided between the bent portion and a die pad supporting portion in the vicinity of the die pad, the width-enlarged portion having a width larger than that of the suspension lead, and
   the width-enlarged portion of the suspension lead in a direction opposite to the deviation of the die pad has a larger length than the width-enlarged portion of the suspension lead in a direction of the deviation of the die pad.

6. A semiconductor device including the lead frame according to claim 1, wherein one of the two die pads located within the lead frame and differing in size deviates toward a resin injection hole with respect to the main plane center line of the resin molding area, the one die pad being on a side close to the resin injection hole.

7. The semiconductor device according to claim 6, wherein a longest metal wire is located in a downstream region of a molding resin flow than the die pad located to deviate from the main plane center line of the resin molding area.

8. The semiconductor device according to claim 6, wherein the semiconductor device has a resin thickness in a range of from 1.4 mm to 0.7 mm.

9. The semiconductor device according to claim 6, wherein one of the two die pads differing in size and located close to the resin injection hole has a Z-directional vertical variation having an inclination slanting from a position close to the resin injection hole to a position apart from the resin injection hole, and an amount of the variation is not more than 0.10 mm.

* * * * *